United States Patent
Lee

(10) Patent No.: US 6,432,783 B1
(45) Date of Patent: Aug. 13, 2002

(54) METHOD FOR DOPING A SEMICONDUCTOR DEVICE THROUGH A MASK

(75) Inventor: Hi Deok Lee, Chungcheongbuk-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/722,818

(22) Filed: Nov. 28, 2000

(30) Foreign Application Priority Data

May 1, 2000 (KR) ............................................. 23276/00

(51) Int. Cl.[7] ...................... H01L 21/336; H01L 21/425
(52) U.S. Cl. ...................... 438/301; 438/514; 438/914; 438/942
(58) Field of Search .................................. 438/301, 229, 438/510, 514, 789, 914, 942, 542

(56) References Cited

U.S. PATENT DOCUMENTS 4,256,829 A * 3/1981 Daniel ..................... 250/492.2
5,681,769 A * 10/1997 Lien ............................ 438/297
6,211,555 B1 * 4/2001 Randazzo et al. .......... 257/368
6,297,111 B1 * 10/2001 Krivokapic ................. 438/289

OTHER PUBLICATIONS

S. Geissler et al., "A New Three-Dimensional MOSFET Gate-Induced Drain Leakage Effect in Narrow Deep Submicron Devices", IEDM, 839–842, 1991.

* cited by examiner

*Primary Examiner*—Richard Elms
*Assistant Examiner*—Adam Pyonin
(74) *Attorney, Agent, or Firm*—Birch, Stewart, Kolasch & Birch, LLP

(57) ABSTRACT

The manufacturing method produces a semiconductor in which current is not generated during the off state by reducing the electric field at the corner of an active region. The method includes patterning a gate material layer on a predetermined portion on the active region. The mask has an open region which exposes the active region but does not expose the filed region. A gate electrode and source/drain regions are formed by doping impurities into the exposed gate material layer and the active region.

12 Claims, 8 Drawing Sheets

METHOD FOR DOPING A SEMICONDUCTOR DEVICE THROUGH A MASK

BACKGROUND OF THE INVENTION

1. Field of the Invention

The invention relates to a semiconductor device and to a method for manufacturing a highly integrated semiconductor device.

2. Background of the Related Art

The increasing integration of semiconductor devices has resulted in a reduction in design parameters. Therefore, current trends in manufacturing design reduce cell size to include reductions of gate electrode width and a channel length.

However, reduction of the cell size for high integration has limitations. Also, problems in operation and reliability of the devices remain even though the cell size is reduced. Particularly, the width of the gate electrode is very narrow in subminiature semiconductor devices, and this results in some problems.

One problem is gate induced drain leakage (GIDL). GIDL occurs in a trench-isolation structure and particularly in the three-dimensional (3-D) intersection of the gate-to-drain and the trench corner.

Typically, an electric field generated at a two-dimensional (2-D) region of the gate-to-drain overlap. In the trench isolation structure, the electric field at the 3-D intersection is significantly higher than the 2-D gate-to-drain overlap region by GIDL at the trench corner.

A related art method for manufacturing a semiconductor device will now be described with reference to the appended drawings.

In the related art method, a polygate is doped when forming MOS devices such as NMOS, PMOS and CMOS. FIGS. 1a and 1b show a method for doping the polygate in forming the CMOS device.

FIG. 1a shows a region A at which a PMOS device will be formed and a region B at which a NMOS device will be formed.

A first active region 11 and a second active region 11a are isolated from each other by a device isolation region formed by a trench isolation process. The first active region 11 is an active region of the PMOS device while the second active region 11a is an active region of the NMOS device.

Subsequently, a polysilicon layer on which impurities are not doped is formed on the whole surface of the active regions and then patterned to form a polygate 12 across the first and second active regions 11 and 11a.

Impurities are doped on the polygate 12. The doping is possible by one of two steps. One step is to separately dope the impurities on the polygate 12 only. The other step is to dope the impurities on the polygate 12 simultaneous with injecting the impurities into source/drain regions.

Typically, the concentration of the impurities for the polygate is higher than that for the source/drain regions. Accordingly, when the polygate and the source/drain regions are doped with the impurities by separate doping steps, the concentration of the Impurities for the source/drain regions is lower than that for the polygate.

However, when the polygate and the source/drain are simultaneously doped with the impurities, the concentration of the impurities for the source/drain region should be higher than that for the polygate. That is, the general concentration of the impurities for the source/drain regions is insufficient to dope the polygate. Therefore, the concentration of the impurities for the source/drain regions should be made higher than the general concentration so as to satisfy the doping concentration of the polygate.

In the related art method, the polygate is doped with the impurities by injecting the impurities into the source/drain regions. As illustrated in FIG. 1a, a first mask 13 is formed so that the region A is exposed. Afterwards, the polygate 12 is formed. That is, the first mask 13 exposes only the region A. Then, impurity ions of P conductive type are injected into the whole surface to dope the polygate 12 and the first active region 11.

Accordingly, the impurities are doped on the exposed polygate 12 and also doped on the first active region 11 which is at both sides of the polygate 12, so that source/drain impurity regions 14 and 15 of PMOS are formed.

The injected impurities are B ions or $BF_2$ ions.

As illustrated in FIG. 1b, the first mask 13 is removed and a second mask 16 is formed so as to expose the region B. Impurity ions of N conductive type are injected into the whole surface so that exposed portions of the polygate 12 and the second active region 11a are doped with the impurity ions.

As a result, the N conductive type impurities are doped on the polygate 12 and the second active region 11a, so that source and drain impurity regions 17 and 18 of NMOS are formed.

The injected impurities are As ions or P ions.

The related art is further explained by FIG. 2a, which is a sectional view taken along line 2a—2a of FIG. 1a. The polygate forms by doping through an open region of a mask. As a result of doping into the whole surface, an electric field converges at the corner of the active region A by the gate electrode.

FIG. 2b shows a sectional view taken along line 2b—2b of FIG. 1a. When an electric field is converges at the corner of the active region by the gate electrode, a channel is formed between the source and the drain by charges at the corner of the active region.

The aforementioned related art method for manufacturing a semiconductor device has several problems.

Reducing the device size results in that the electric field by the gate is stronger at the corner of the active region than other regions, so that the threshold voltage of the active region is lowered. Accordingly, a current generates during the off state in which the voltage between the drain and the source is low. This increases power consumption. Particularly, this problem becomes more serious as the channel becomes narrower.

SUMMARY OF THE INVENTION

Accordingly, the invention is directed, in part, to a method for manufacturing a semiconductor device that substantially obviates one or more of the problems due to limitations and disadvantages of the related art.

The invention, in part, provides a semiconductor device in which no current generates during the off state by reducing the electric field at the corner of an active region.

The invention, in part, provides a method for manufacturing a semiconductor device in which no current generates during the off state by reducing the electric field at the corner of an active region.

The invention, in part, provides a method for manufacturing a semiconductor device that includes the steps of patterning a gate material layer on a portion on an active region of a semiconductor substrate; forming a mask having an open region over at least a portion of the active region but not substantially over a field region of the semiconductor substrate; and forming a gate electrode, source regions and drain regions by doping impurity ions of a conductive type opposite to that of the exposed gate material layer and the active region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description is serve to explain the principles of the embodiments of the invention.

FIG. 2a is a sectional view taken along line 2a—2a of FIG. 1a.

FIG. 2b is a sectional view taken along line 2b—2b of FIG. 1a.

DETAILED DESCRIPTION

Advantages of the present invention will become more apparent from the detailed description given herein after. However, it should be understood that the detailed description and specific examples, while indicating preferred embodiments of the invention, are given by way of illustration only, since various changes and modifications within the spirit and scope of the invention will become apparent to those skilled in the art from this detailed description.

The invention utilizes a gate electrode of an active region to increase an electric field so as to prevent current from occurring between a source and a drain during the off state. The present invention is characterized by a mask having almost the same size as that of the active region when doping the gate so as to reduce doping concentration of the gate where the electric field occurs.

Figure 1A:
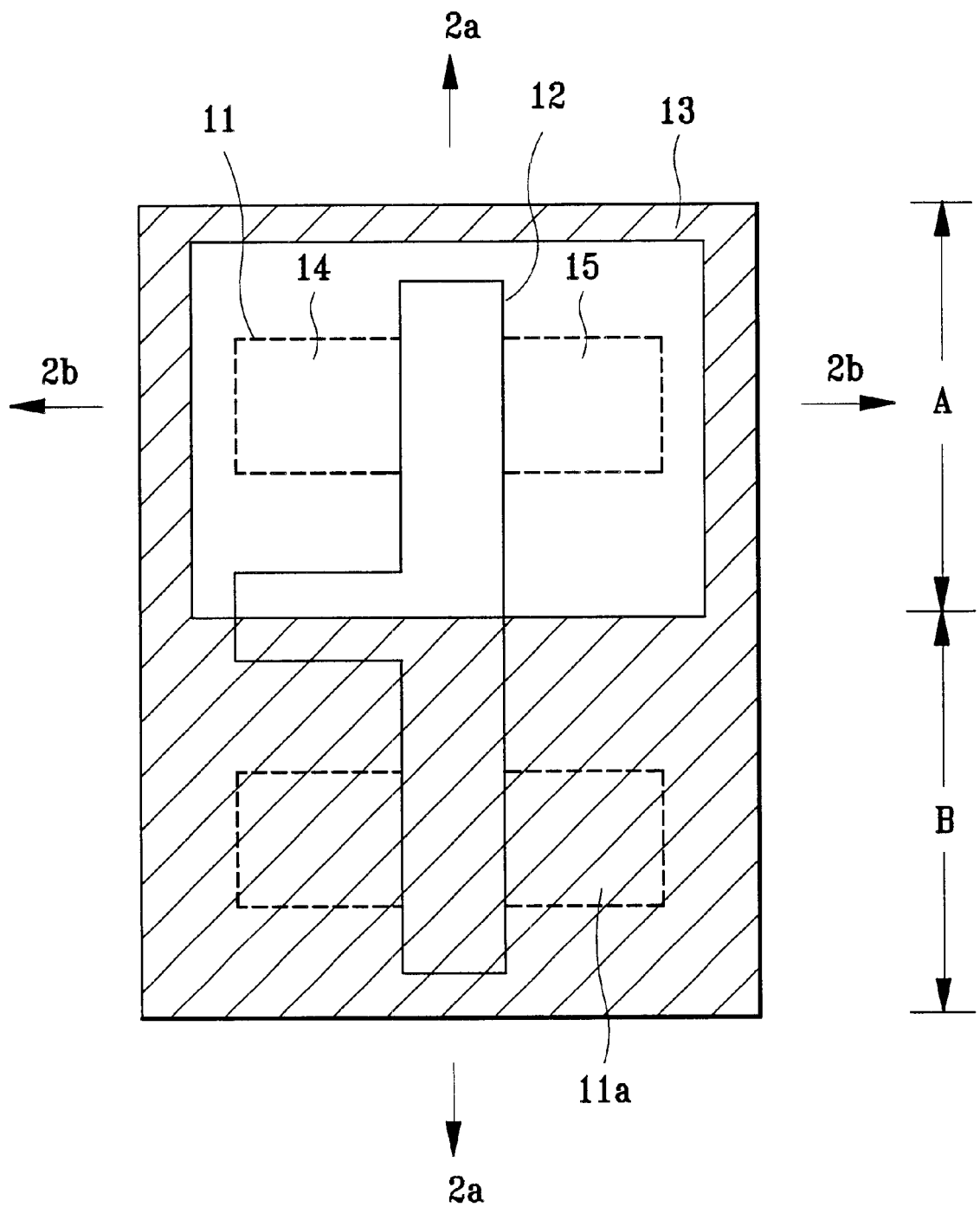
FIGS. 1a and 1b are layout processing views showing a related art method for manufacturing a semiconductor device.
Figure 1B:
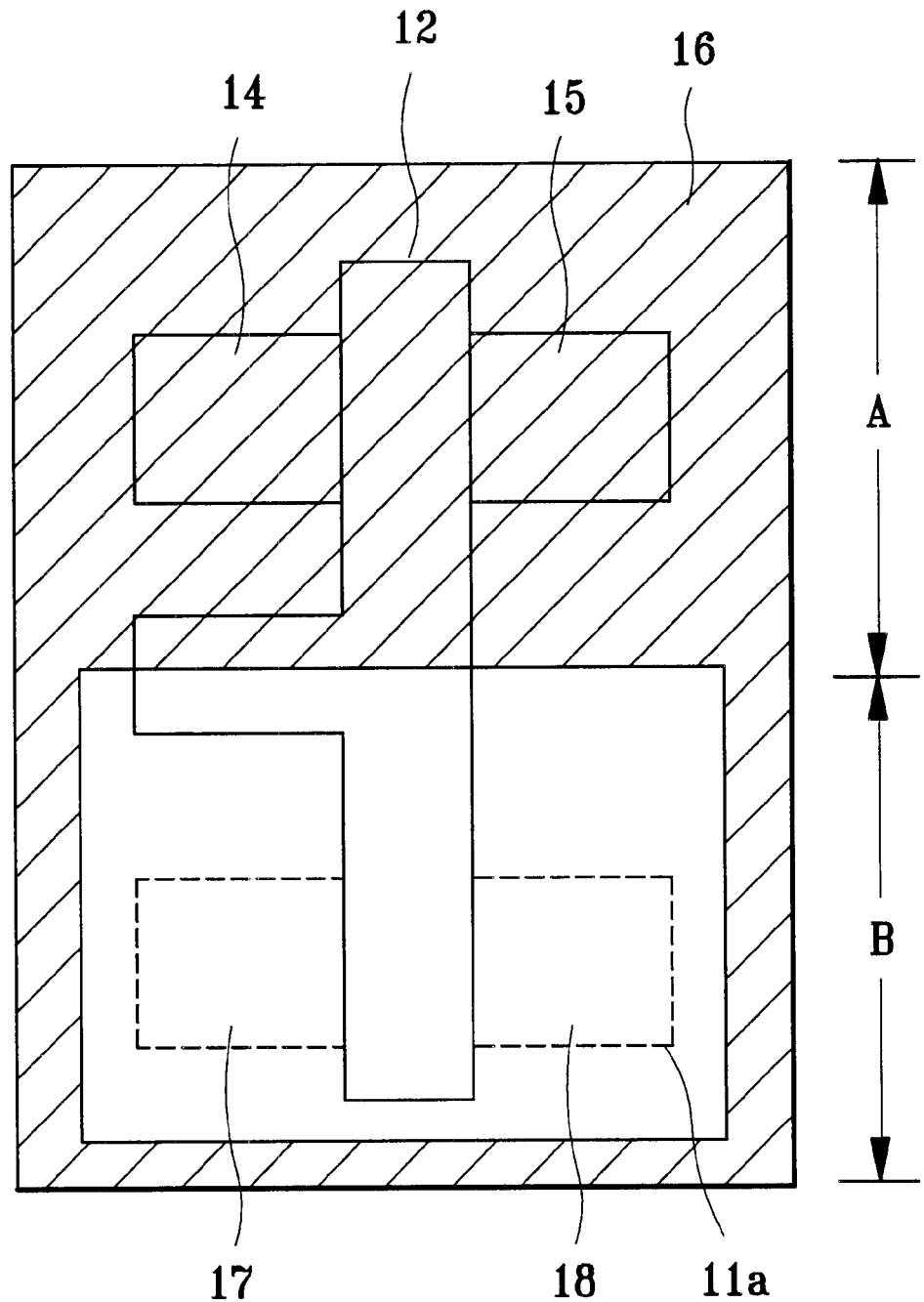
Figure 2A:
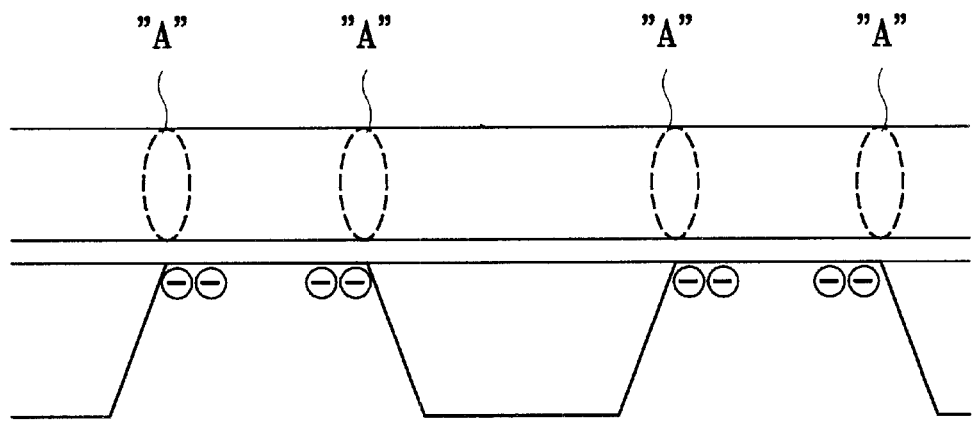
Figure 2B:
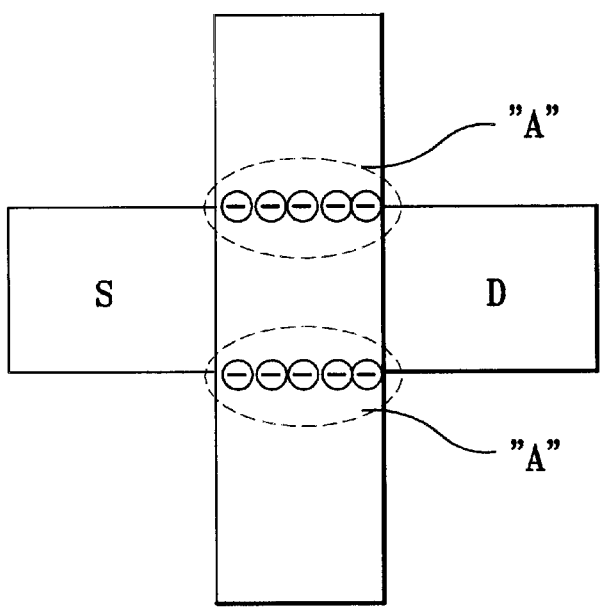
Figure 3:
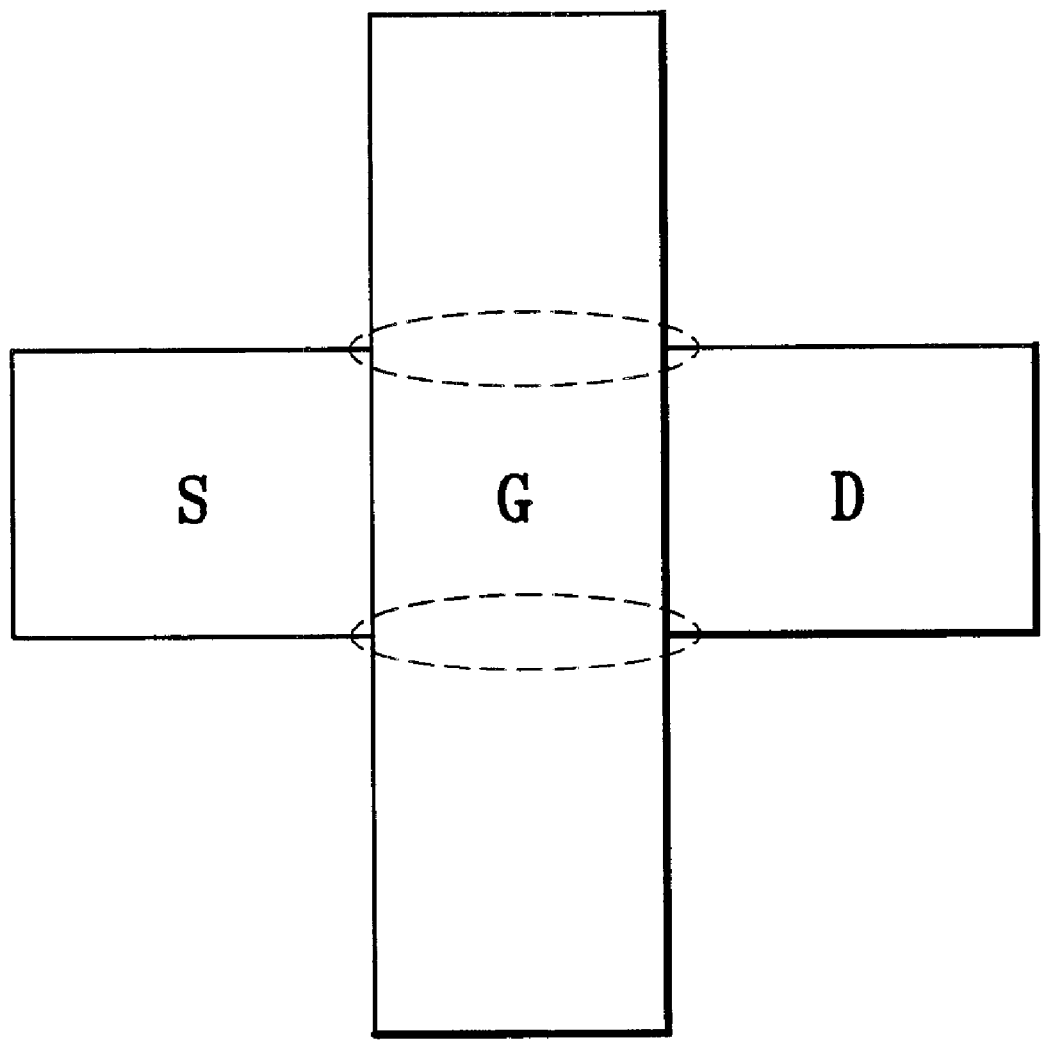
FIG. 3 is a layout showing that electric field occurs at the corner of a gate.

FIG. 3 shows a layout view of a method for manufacturing a semiconductor device of the invention. In the invention, it is intended that electric field does not increase in a dotted line of FIG. 3.

Figure 4A:
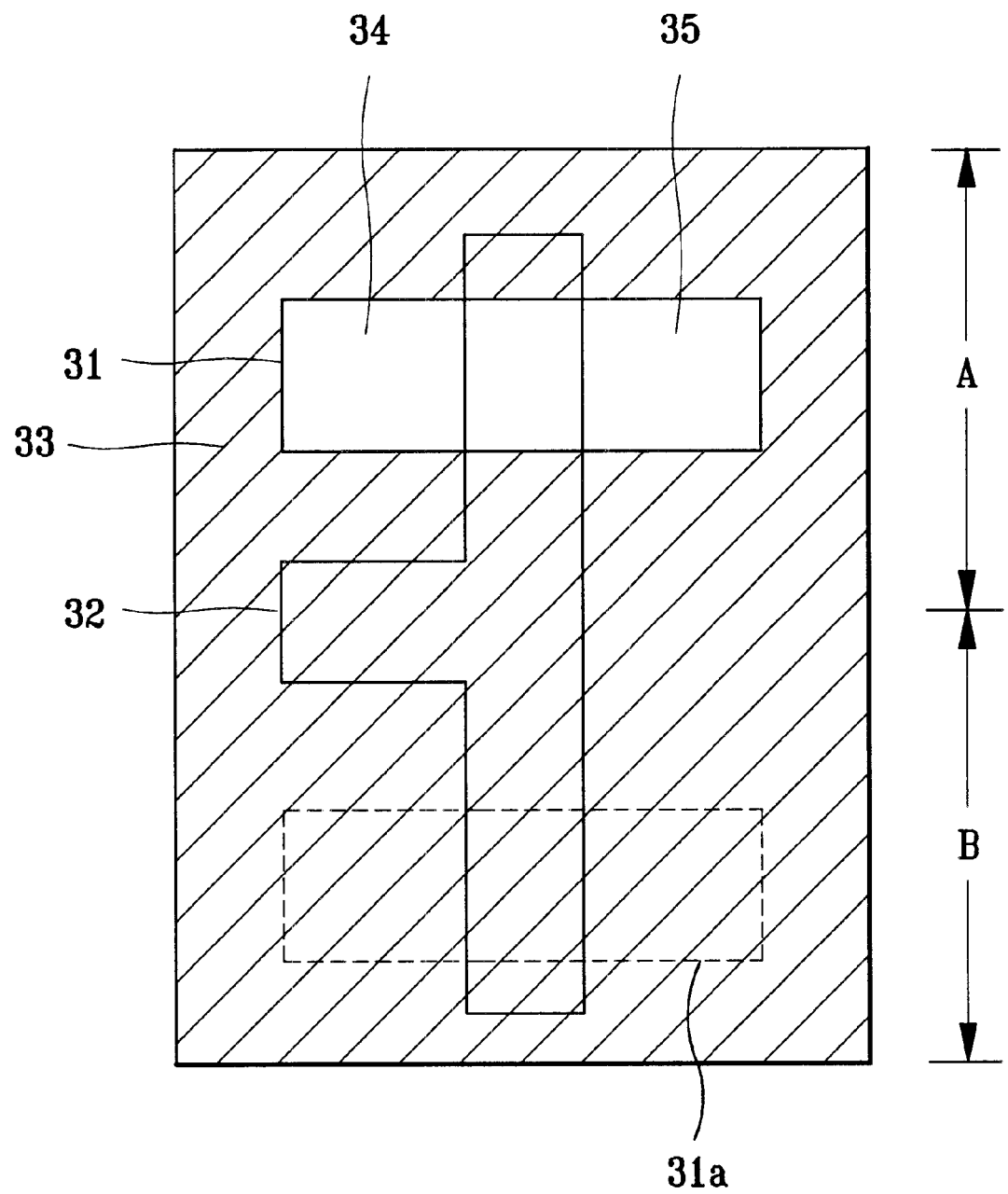
FIGS. 4a and 4b are layout processing views showing a method for manufacturing a semiconductor device according to an embodiment of the present invention.
Figure 4B:
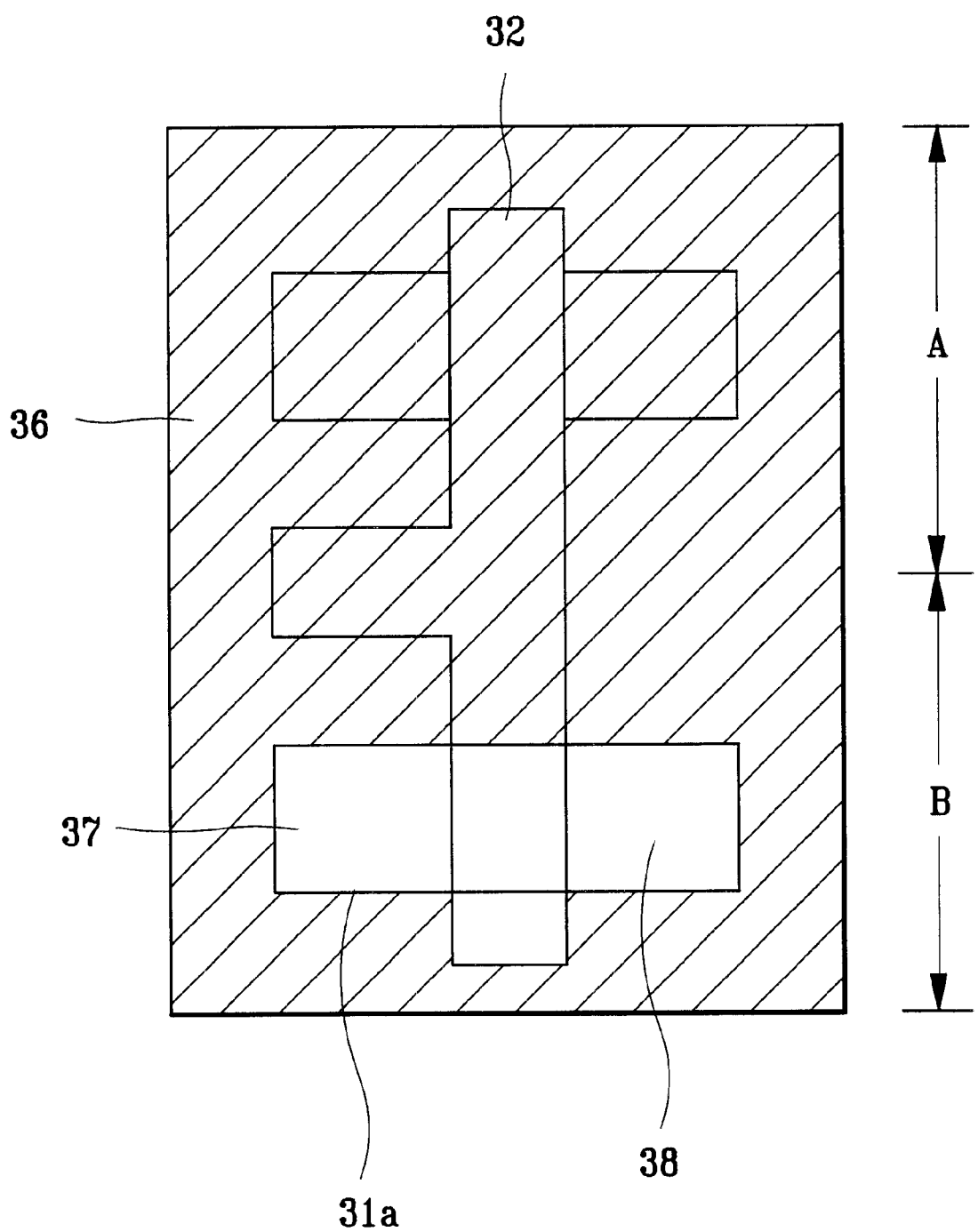

FIGS. 4a and 4b are layout processing views showing a method for manufacturing a semiconductor device according to a first embodiment of the present invention. In the method according to the first embodiment of the present invention, a polygate is doped when a MOS device such as NMOS, PMOS and CMOS is formed.

For reference, in the first embodiment, an example of the MOS device includes a CMOS device.

As illustrated in FIG. 4a, region A defines a semiconductor substrate where a PMOS device will be formed and region B where an NMOS device will be formed. Thereafter, a first active region 31 and a second active region 31a are defined by a device isolation region that is formed by a trench isolation process.

Subsequently, a polysilicon layer on which impurities are not doped is formed on the whole surface of the semiconductor substrate including the active regions 31 and 31a. The polysilicon layer is then patterned to form a polygate 32 across the first and second active regions 31 and 31a.

A first mask 33 is formed to dope the impurities on the polygate 32 of the region A. At this time, an open region of the first mask 33 is formed to expose only the first active region 31 of the region A. In contrast, the related art uses a mask has been formed to expose the region A including the active region and the device isolation region. However, in this embodiment of the present invention, the open region of the mask 33 has a size almost equal to the size of the active region. The open region of the mask may be greater than or smaller than the active region by 0.1 $\mu$m.

After the first mask 33 is formed, a P conductive type impurity ion injection type is performed so that the exposed polygate 32 is doped, and source and drain impurity regions 34 and 35 are formed in the first active region 31. At this time, the injected impurities are B ions or $BF_2$ ions. However, the injected impurities are not restricted to boron based components, and other types of impurities may be injected.

FIG. 4b shows removal of the first mask 33, and a second mask 36 is formed so as to expose the second active region 31a of the region B. Again, the open region of the mask 36 has a size almost equal to the size of the active region (±0.1 $\mu$m). Impurity ions of a conductive type opposite to the impurities injected into the PMOS region are injected into the exposed second active region 31a, and then an impurity diffusion process is performed. Thus, the impurity ions are doped on the polygate 32, and source/drain impurity regions 37 and 38 are simultaneously formed. At this time, the injected impurities are As ions or P ions. However, other types of impurities can be injected.

Meanwhile, in doping the polygate, impurities for doping the polygate may be injected into a region where the polygate will be formed prior to forming a polysilicon layer. That is, after doping the impurities on the semiconductor substrate of the region where the polygate will be formed, the polygate is first formed and then doped by diffusion process subsequently, source and drain regions are formed in the respective PMOS and NMOS regions.

In the first embodiment of the present invention, the impurities doped on the polygate diffuse laterally during the diffusion process, thereby lowering the doping concentration at the corner of the polygate. Accordingly, the electric field is reduced at the corner of the polygate so that a channel is prevented from forming between the source and the drain at off state.

In comparing the related art, since the concentration of the impurities for the polygate is the same as that for the source/drain regions, the concentration of the impurities at the corner of the polygate are not changed even though diffusion process is performed. On the other hand, the invention has the concentration of the impurities for the source/drain regions lower than that for the polygate, and the impurities of the polygate having higher concentration diffuse into the source or the drain having lower concentration by the diffusion process. Thus, it is possible to lower the doping concentration of the polygate.

A method for manufacturing a semiconductor device according to a second embodiment of the invention will be described with reference to FIGS. 5a and 5b.

In the second embodiment of the invention, an open region of each mask has a smaller size, so that only the gate electrode on the active region as exposed.

Figure 5A:
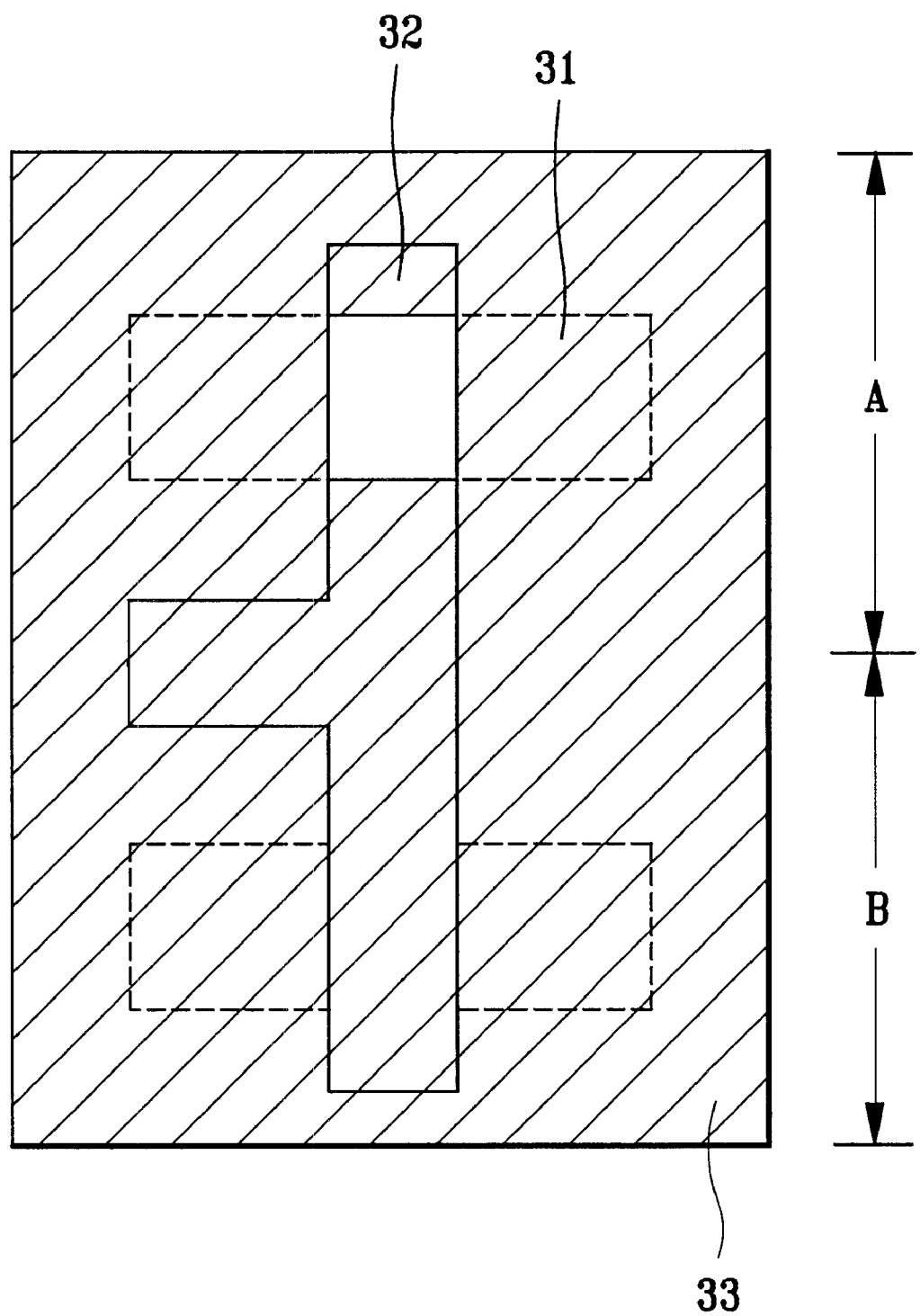
FIGS. 5a and 5b are layout processing views showing a method for manufacturing a semiconductor device according to an embodiment of the present invention.

As illustrated in FIG. 5a, a semiconductor substrate is divided into a region A where a PMOS device will be formed and a region B where an NMOS device will be formed. A device isolation region formed by a trench isolation process defines a first active region 31 and a second active region 31a.

Subsequently, a polysilicon layer on which impurities are not doped is formed on the whole surface of the semiconductor substrate and then patterned to form a polygate 32.

A first mask 33 is used to dope impurities on the polygate 32 of the region A. At this time, an open region of the first mask 33 forms to expose only the first active region 31 of the region A. In comparison, the related art uses a mask that has been formed to expose the region A including the active region and the device isolation region. In the first embodiment of the present invention, the open region of the mask is almost equal to the size of the active region. However, in the second embodiment of the present invention, the open region of the mask is almost same as the polygate on the active region. The open region of the mask may be greater than or smaller than the exposed polygate by 0.1 μm.

After the first mask 33 is formed, P conductive type impurity ion injection is performed so that the exposed polygate 32 is doped.

Figure 5B:
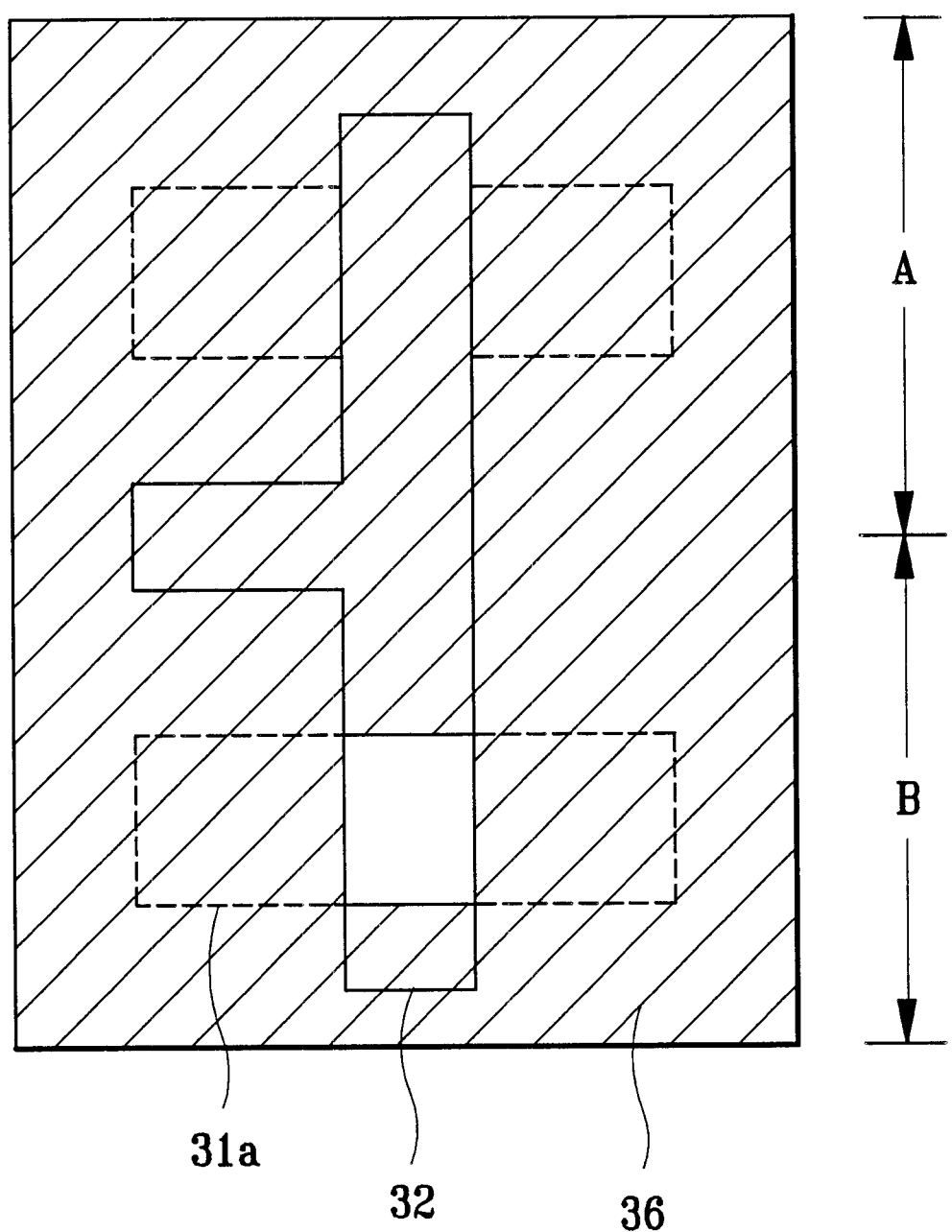

Subsequently, as illustrated in FIG. 5b, the first mask 33 is removed. A second mask 36 is then formed so as to expose the polygate 32 which is formed across the second active region 31a of the region B. the open region of the mask is almost same as the polygate on the active region. The open region of the mask may be greater than or smaller than the exposed polygate by 0.1 μm. impurity ions of a conductive type opposite to the impurities injected into the PMOS region are injected into the exposed polygate. Then, the impurity diffusion process is performed. Thus, the impurity ions are doped on the polygate 32.

During doping the polygate, impurities may be injected into a region where the polygate will be formed prior to forming a polysilicon layer. That is, after doping the impurities on the region where the polygate will be formed, the impurities diffuse to the polygate by the diffusion process.

Subsequently, source and drain regions may be formed in respective PMOS and NMOS regions. The source and drain regions are formed by impurity ion injection using the mask in the active region where the PMOS will be formed (not shown).

The mask is then removed, and the source and drain regions are complete. Thus, the method for manufacturing a semiconductor device according to a second embodiment of the present invention is completed.

As discussed above, the method for manufacturing a semiconductor device has the following advantages.

The dopant concentration at the corner of the polygate can be lowered, and hence it is possible to prevent the threshold voltage from being reduced and the electric field from increasing at the corner. This prevents the current from occurring between the source and the drain at the off state. Accordingly, power consumption can be minimized. Particularly, off state current can be avoided in the device having a polygate of a narrow width.

It is to be understood that the foregoing descriptions and specific embodiments shown herein are merely illustrative of the best mode of the invention and the principles thereof, and that modifications and additions may be easily made by those skilled in the art without departing from the spirit and scope of the invention, which is therefore understood to be limited only by the scope of the appended claims.

What is claimed is:

1. A method for manufacturing a semiconductor device comprising the steps of:

patterning a gate material layer on an active region of a semiconductor substrate;

forming a mask having an open region over at least a portion of the active region but not over a field region of the semiconductor substrate so as to only expose the gate material layer on the active region, and the open region of the mask has the same size as that of the active region, or the open region of the mask is greater or smaller than the active region by about 1 μm; and forming a gate electrode, source regions and drain regions by doping impurity ions of a conductivity opposite to that of the exposed gate material layer and the active region; the forming the gate electrode including:

injecting impurity ions into the active region where the gate electrode will be formed; and diffusing the impurity ions into the gate material layer; or doping first impurity ions having a conductivity opposite to the substrate on the exposed gate material layer to form the gate electrode; and injecting second impurity ions for source and drain having a conductivity opposite to the substrate into both sides of the gate electrode, and not on the substrate itself, wherein a concentration of the first impurity ions is greater than a concentration of the second impurity ions.

2. The method of claim 1, wherein the open region of the mask is greater or smaller than the gate material layer on the active region by about 0.1 μm.

3. A method for manufacturing a semiconductor device comprising the steps of:

patterning a gate material layer across a first active region and a second active region of a semiconductor substrate;

forming a first mask having an open region over the first active region but not over a field region of the semiconductor substrate;

forming a first gate electrode, a first source region and a first drain region by injecting impurity ions of a first conductivity into the exposed gate material layer and the first active region but not the second active region;

removing the first mask;

forming a second mask having an open region over the second active region but not over the field region; and forming a second gate electrode, a second source region and a second drain region by injecting impurity ions of a second conductivity into the exposed gate material layer and the second active region but not the first active region.

4. The method of claim 3, wherein the open region of the first mask has the same size as that of the first active region and the open region of the second mask has the same size as that of the second active region.

5. The method of claim 3, wherein the open regions of the first and second masks are greater or smaller than the first and second active regions by about 0.1 μm, respectively.

6. The method of claim 3, further comprising:

injecting first the impurity ions having a first conductivity into the first active region where the first gate electrode will be formed;

injecting second the impurity ions having a second conductivity opposite to the first conductivity into the second active region where the second gate electrode will be formed; and diffusing the impurity ions into the gate material layer by diffusion process.

7. The method of claim 6, after the step of forming the first and second gate electrodes, further comprising the steps of:

forming, first source and drain regions by injecting the impurity ions having a first conductivity into the first active region at both sides of the first gate electrode; and forming second source and drain regions by injecting the impurity ions having a second conductivity opposite to the first conductivity into the second active region at both sides of the gate electrode.

8. A method for manufacturing a semiconductor device comprising the steps of:

patterning a gate material layer across first and second active regions of a semiconductor substrate;

forming a first mask having; an open region over the gate material layer on the first active region but not over a field region of the semiconductor substrate;

forming a first gate electrode by doping impurity ions of a first conductivity on the gate material layer exposed by the first mask;

removing the first mask;

forming a second mask having an open region over the gate material layer on the second active region but not over the field region; and forming a second gate electrode by doping impurity ions of a second conductivity on the gate material layer exposed by the second mask.

9. The method of claim 8, further comprising the steps of:

forming first source and drain regions in the first active region at both sides of the first gate electrode after forming the second gate electrode; and forming second source and drain regions in the second active region at both sides of the second gate electrode.

10. The method of claim 8, wherein the open regions of the first and second masks are greater or smaller than the gate electrodes on the first and second active regions by about 0.1 $\mu$m, respectively.

11. The method of claim 8, further comprising:

injecting the impurity ions having a first conductivity into the first active region where the first gate electrode will be formed;

injecting the impurity ions having a second conductivity opposite to the first conductivity into the second active region where the second gate electrode will be formed; and diffusing the impurity ions into the gate material layer.

12. The method of claim 11, further comprising the steps of:

forming first source and drain regions at both sides of the first gate electrode after performing the diffusion process; and forming second source and drain regions having conductivity opposite to that of the first source and drain regions, at both sides of the second gate electrode.

* * * * *